(12) United States Patent
Cheng et al.

(10) Patent No.: US 10,199,609 B2
(45) Date of Patent: Feb. 5, 2019

(54) ORGANIC ELECTROLUMINESCENT DISPLAY PANEL INCLUDING LIGHT-ISOLATING MEMBERS, METHOD FOR MANUFACTURING THE SAME AND DISPLAY APPARATUS

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/435,399

(22) PCT Filed: May 30, 2014

(86) PCT No.: PCT/CN2014/078944
§ 371 (c)(1),
(2) Date: Apr. 13, 2015

(87) PCT Pub. No.: WO2015/090010
PCT Pub. Date: Jun. 25, 2015

(65) Prior Publication Data
US 2016/0013451 A1   Jan. 14, 2016

(30) Foreign Application Priority Data
Dec. 20, 2013 (CN) .......................... 2013 1 0711672

(51) Int. Cl.
*H01L 51/50* (2006.01)
*H01L 51/52* (2006.01)
(Continued)

(52) U.S. Cl.
CPC ........ *H01L 51/5284* (2013.01); *H01L 27/322* (2013.01); *H01L 27/3209* (2013.01);
(Continued)

(58) Field of Classification Search
CPC ............ H01L 51/5284; H01L 27/3246; H01L 27/322; H01L 51/5256
See application file for complete search history.

(56) References Cited

U.S. PATENT DOCUMENTS

| 2003/0230972 A1* | 12/2003 | Cok | ..................... H01L 27/3211 |
| | | | 313/504 |
| 2005/0093435 A1* | 5/2005 | Suh | ....................... H01L 27/322 |
| | | | 313/504 |

(Continued)

FOREIGN PATENT DOCUMENTS

| CN | 101800194 A | 8/2010 |
| CN | 101933397 A | 12/2010 |

(Continued)

OTHER PUBLICATIONS

English translation of Box V of the Written Opinion dated Aug. 27, 2015, for corresponding PCT Application No. PCT/CN2014/087522.

(Continued)

*Primary Examiner* — Lex Malsawma
*Assistant Examiner* — Laura Dykes
(74) *Attorney, Agent, or Firm* — Kinney & Lange, P.A.

(57) ABSTRACT

Disclosed is an organic electroluminescent display panel, a method for manufacturing the same and a display apparatus. The organic electroluminescent display panel comprises a plurality of luminescent units, wherein light-isolating members are disposed between the plurality of luminescent units for isolating light emitted from the respective luminescent units. Therefore, the organic electroluminescent display panel, the method for manufacturing the same and the display apparatus according to the present invention can (Continued)

prevent mutual interference between the light from the respective luminescent units of the organic electroluminescent display panel.

9 Claims, 2 Drawing Sheets

(51) Int. Cl.
*H01L 27/32* (2006.01)
*H01L 51/56* (2006.01)

(52) U.S. Cl.
CPC ...... *H01L 27/3246* (2013.01); *H01L 51/5256* (2013.01); *H01L 51/5262* (2013.01); *H01L 51/56* (2013.01); *H01L 51/5253* (2013.01); *H01L 2227/323* (2013.01)

(56) References Cited

U.S. PATENT DOCUMENTS

| | | | | |
|---|---|---|---|---|
| 2005/0146266 | A1* | 7/2005 | Kuma | H01L 27/322 313/506 |
| 2005/0212447 | A1 | 9/2005 | Oh et al. | |
| 2005/0225238 | A1* | 10/2005 | Yamazaki | H01L 27/322 313/506 |
| 2005/0242713 | A1* | 11/2005 | Yamazaki | H01L 51/5284 313/503 |
| 2010/0171107 | A1* | 7/2010 | Jung | H01L 27/322 257/40 |
| 2010/0232162 | A1* | 9/2010 | Shin | H01L 27/322 362/293 |
| 2014/0117334 | A1* | 5/2014 | Nakamura | H01L 27/322 257/40 |

FOREIGN PATENT DOCUMENTS

| | | |
|---|---|---|
| CN | 101960917 A | 1/2011 |
| CN | 102299165 A | 12/2011 |
| CN | 103456764 A | 12/2013 |
| CN | 103700687 A | 4/2014 |
| KR | 20100131074 A | 12/2010 |
| KR | 20120122534 A | 11/2012 |

OTHER PUBLICATIONS

English translation of the first Chinese Office Action dated Oct. 10, 2015, for corresponding Chinese Application No. 201310711672.9.
International Search Report and Written Opinion dated Aug. 27, 2015 for corresponding PCT Application No. PCT/CN2014/078944.
Second Chinese Office Action dated May 5, 2016, for corresponding Chinese Application No. 201310711672.9.
Decision of Rejection dated Aug. 31, 2016, for corresponding Chinese Application No. 201310711672.9.
Chinese Reexamination Notification and it English translation dated Jun. 28, 2017, for corresponding Chinese Application No. 201310711672.9.
Chinese Reexamination Decision, for Chinese Patent Application No. 201310711672.9, dated Nov. 27, 2017, 21 pages.

* cited by examiner

ORGANIC ELECTROLUMINESCENT DISPLAY PANEL INCLUDING LIGHT-ISOLATING MEMBERS, METHOD FOR MANUFACTURING THE SAME AND DISPLAY APPARATUS

BACKGROUND OF THE INVENTION

Field of the Invention

Embodiments of the present invention generally relate to the field of display technology, in particular to an organic electroluminescent display panel, a method for manufacturing the same and a display apparatus.

Description of the Related Art

An Organic electroluminescent display (OLED) has a self-luminous characteristics and includes a very thin organic material layer, which will emit light when an electric current flows therethrough. The OLED has advantages of low energy consumption, high brightness, fast response time, wide viewing angle, light weight and the like, and thus is widely used for mobile communication terminals, personal digital assistants, handheld computers and so on.

Each pixel of the OLED is typically divided into three luminescent units of red, green and blue, each of which generates a corresponding monochromatic light. Various colors are formed by mixing three monochromatic lights of red, green and blue to achieve a full-color display of the OLED panel.

However, the respective luminescent units of the OLED panel often interfere with each other when emitting the light, which would result in poor colorizing effect, thereby affecting full-color display effect of the OLED display panel.

SUMMARY OF THE INVENTION

In order to overcome or alleviate at least one aspect of the above mentioned disadvantages, embodiments of the present invention provide an organic electroluminescent display panel, a method for manufacturing the same and a display apparatus, which can prevent interference between the respective luminescent units of the OLED panel, thereby improving the full-color display effect of the OLED.

According to an aspect of the present invention, there is provided an organic electroluminescent display panel comprising a plurality of luminescent units, each of which including a first electrode layer, an organic luminescent layer disposed on the first electrode layer, and a second electrode layer disposed on the organic luminescent layer, wherein light-isolating members are disposed between the plurality of luminescent units for isolating light emitted from the respective luminescent units.

In an organic electroluminescent display panel according to an exemplary embodiment of the present invention, at least one of the first electrode layers, the organic luminescent layers and the second electrode layers of the respective luminescent units are isolated by the light-isolating members.

In an organic electroluminescent display panel according to an exemplary embodiment of the present invention, the organic electroluminescent display panel further comprises a substrate on which the plurality of luminescent units are disposed, wherein the first electrode layer, the organic luminescent layer and the second electrode layer are disposed on the substrate in this order, and the first electrode layers of the respective luminescent units are separated from each other with the light-isolating members disposed therebetween.

According to an exemplary embodiment of the present invention, the light-isolating members are protrusively disposed between the respective luminescent units.

Alternatively, the light-isolating member is made of an opaque polymer composite material.

Alternatively, the light-isolating member is made of a black matrix material.

Further, the organic luminescent layers of the respective luminescent units are continuously disposed on the first electrode layers of the respective luminescent units and the light-isolating members between the respective luminescent units; or the organic luminescent layers of the respective luminescent units are discontinuously disposed on the first electrode layers between the respective light-isolating members.

Alternatively, a passivation layer is disposed on the second electrode layer, and a color filter film is disposed on the passivation layer at positions corresponding to the second electrode layers.

Alternatively, a packaging layer is disposed on the color filter film.

Alternatively, a color filter film is disposed on the second electrode layer between the respective light-isolating members.

Alternatively, a passivation layer and a packaging layer are sequentially disposed on the color filter film.

According to another aspect of the present invention, there is provided a display apparatus comprising any one of the organic electroluminescent display panels as described above.

According to yet another aspect of the present invention, there is provided a method for manufacturing an organic electroluminescent display panel comprising:

forming a first electrode layer on a substrate, the first electrode layer including at least two first electrodes spaced apart from each other;

forming opaque light-isolating members between the respective first electrodes of the first electrode layer, the light-isolating members severing to isolate light emitted from the respective luminescent units to prevent interference between the light emitted from the respective luminescent units; and forming an organic luminescent layer and a second electrode layer sequentially on the substrate on which the first electrode layer and the light-isolating members have been formed.

Alternatively, the light-isolating member is made of an opaque polymer composite material.

Alternatively, the light-isolating member is made of a black matrix material.

Particularly, the step of forming an organic luminescent layer and a second electrode layer sequentially on the substrate on which the first electrode layer and the light-isolating members have been formed further comprises:

forming a continuous organic luminescent layer on the substrate on which the first electrode layer and the light-isolating members have been formed, the organic luminescent layer being continuously formed on the respective first electrodes and the respective light-isolating members; or forming a discontinuous organic luminescent layer on the substrate on which the first electrode layer and the light-isolating members have been formed, the organic luminescent layer being discontinuously formed on the first electrodes between the respective light-isolating members.

Further, after forming the organic luminescent layer and the second electrode layer sequentially on the substrate on which the first electrode layer and the light-isolating members have been formed, the method further comprises:

forming a passivation layer on the second electrode layer; and forming a color filter film on the passivation layer at positions corresponding to the first electrodes.

Alternatively, after forming the color filter film on the passivation layer at positions corresponding to the first electrodes, the method further comprises:

forming a packaging layer on the color filter film.

Alternatively, after forming the organic luminescent layer and the second electrode layer sequentially on the substrate on which the first electrode layer and the light-isolating members have been formed, the method further comprises:

forming a color filter film on the first electrodes between the respective light-isolating members.

Alternatively, after forming the color filter film on the first electrodes between the respective light-isolating members, the method further comprises:

forming a passivation layer and a packaging layer sequentially on the color filter film.

In the organic electroluminescent display panel, the method for manufacturing the same and the display apparatus according to embodiments of the present invention, light-isolating members are disposed between the respective luminescent units. In this way, the respective luminescent units can effectively isolate the light emitted from the organic luminescent layers of the respective luminescent units to prevent the interference between the light emitted from the respective luminescent units, thereby improving the full-color display effect of the OLED display panel.

BRIEF DESCRIPTION OF THE DRAWINGS

In order to clearly describe the solutions according to the embodiments of the present invention or the prior art, brief description of the figures to be used in the description of the embodiments of the present invention or the prior art will be made in the following. Apparently, the figures just show some embodiments. For those skilled in the art, other Figs. can be obtained according to these Figs. without inventive labor.

DETAILED DESCRIPTION OF PREFERRED EMBODIMENTS OF THE INVENTION

In order to completely understand the technical solution of the present invention, exemplary embodiments of the present disclosure will be described hereinafter in detail with reference to the attached drawings. Apparently, the described embodiments are merely part of the embodiments of the present invention, rather than all embodiments of the present invention. Based on the embodiments of the present invention described herein, other embodiments acquired by the person skilled in the art without any inventive effort will be within the protection scope of the present invention.

Figure 1:
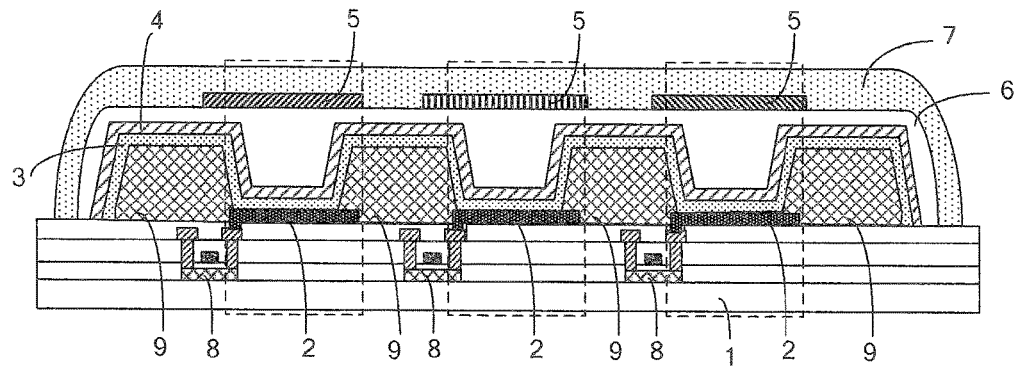
FIG. 1 is a schematic structural view of an organic electroluminescent display panel according to an exemplary embodiment of the present invention.
Figure 2:
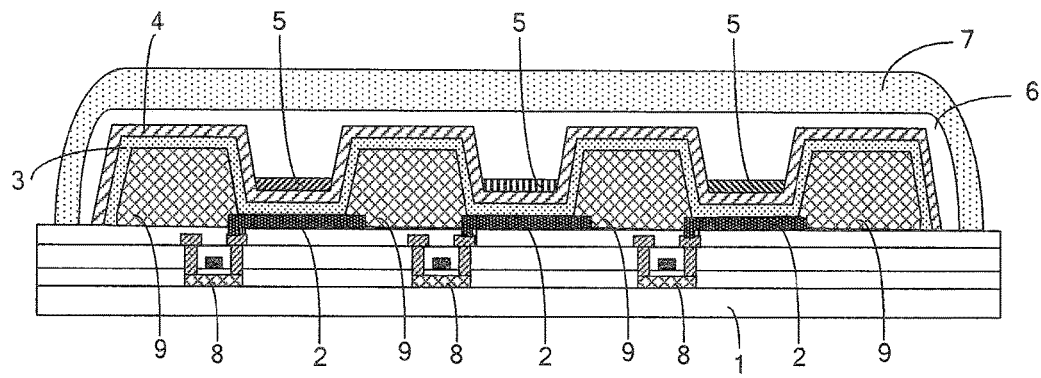
FIG. 2 is a schematic structural view of another organic electroluminescent display panel according to an exemplary embodiment of the present invention.
Figure 3:
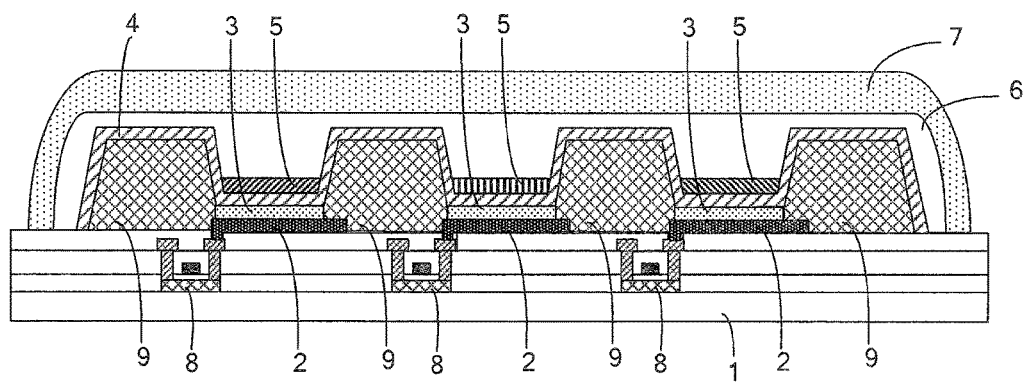
FIG. 3 is a schematic structural view of another organic electroluminescent display panel according to an exemplary embodiment of the present invention.

As shown in FIGS. 1 to 3, an organic electroluminescent display panel according to an embodiment of the present invention comprises a substrate 1, a first electrode layer 2, an organic luminescent layer 3 and a second electrode layer 4 sequentially disposed on the substrate 1. The first electrode layer 2 includes at least two first electrodes spaced apart from each other. Each first electrode, the organic luminescent layer 3 and the second electrode layer 4 directly opposite the first electrode constitute one luminescent unit. For example, as shown in FIG. 1, a region indicated by each dotted line block represents one luminescent unit. Opaque light-isolating members 9 are disposed between the respective first electrodes of the first electrode layer 2 respectively. The light-isolating members 9 are capable of isolating light emitted from the respective luminescent units so as to prevent mutual interference between the light from the respective luminescent units.

As illustrated in FIGS. 1 to 3, the light-isolating members 9 are protrusively disposed between the respective luminescent units to isolate the light emitted from the respective luminescent units.

In the OLED display panel according to an exemplary embodiment of the present invention, each first electrode, the organic luminescent layer 3 and the second electrode layer 4 directly opposite the first electrode constitute one luminescent unit, and the light-isolating members 9 are disposed between the respective first electrodes in the first electrode layer 2. In this way, the respective opaque light-isolating members 9 can effectively isolate the light emitted from the organic luminescent layers 3 in the respective luminescent units to prevent the mutual interference between light from the respective luminescent units, thereby improving full-color display effect of the OLED display panel.

It is noted that the light-isolating members 9 of an embodiment of the present invention are protuberances disposed between the respective first electrodes, and are mainly made of opaque materials. In particular, the light-isolating members 9 may be made of an opaque polymer composite material or a black matrix material. The light-isolating members 9 function to isolate the light emitted from the respective luminescent units and also have a positioning function, which will be described in detail below.

As shown in FIGS. 1 to 3, the OLED display panel may further comprise a thin film transistor layer 8 disposed between the substrate 1 and the first electrode layer 2. Each of the thin film transistors (TFTs) in the thin film transistor layer 8 corresponds to one first electrode and can control the charge and discharge of the first electrode. Thus, each of the luminescent units is controlled by a TFT having a switch function. In this way, each of the luminescent units of the OLED display panel can be selectively and independently adjusted. The technique in which the thin film transistor layer 8 controls each of the luminescent units by controlling the first electrode relates to the prior art and the description thereof will be omitted herein.

In particular, in the OLED display panel according to an embodiment of the present invention, the first electrodes in the first electrode layer 2 are connected with a positive pole of a power supply, and the second electrode layer 4 is connected with a negative pole of the power supply. When an appropriate voltage is applied, positive cavities in each of the first electrodes will meet and combine with negative charges in the second electrode layer 4 in the organic luminescent layer 3 and excite the organic material in the organic luminescent layer 3 to emit light. In particular, for each of the first electrodes in the first electrode layer 2, high power function materials may be selected to facilitate the generation of the cavities. For example, for the first electrode in the first electrode layer 2, transparent conductive film material having a semiconductor characteristic such as Indium Tin Oxide (ITO) or Indium Zinc Oxide (ITO), may be selected. For the second electrode layer 4, low power function materials to be suitable for generation of electrons may be selected. For example, for the second electrode layer 4, metal material such as silver, aluminum, magnesium, calcium, barium and the like may be selected, or composite metal material such as magnesium-silver composite metal material may be selected. Preferably, the second electrode layer 4 may be transparent. Currently, preparing transparent metal material belongs to the prior art, thus the description of preparing the transparent second electrode layer 4 in detail will be omitted herein.

In the OLED display panel, suitable materials may be selected as the organic luminescent layer 3, or the organic luminescent layer 3 may be doped with dyes to obtain desired luminescent color. For example, every three adjacent luminescent units may emit red, green and blue light respectively, so that it is possible to display multicolor by the light of these three colors. Accordingly, for the organic luminescent layers 3 in the luminescent units emitting red, green and blue light, material emitting red, green and blue light may be selected respectively.

In particular, for the organic luminescent layer 3, material having strong fluorescence, good carrier transmission performance, good thermal and chemical stability in a solid state may be selected. For example, for the material emitting green light, tri(8-quinolinol)aluminum $AlQ_3$ may be selected. In addition, it is possible to obtain materials emitting red and blue light by doping the donor luminescent material. For example, it is possible to obtain the material emitting the blue light by doping $AlQ_3$ in the NPB. Currently, in the prior art, it is possible to obtain the materials emitting the red, blue and white light by doping or other processes, thus the description thereof in detail is omitted herein.

Of course, for the organic luminescent layer 3, the materials emitting the white light may be selected and then three primary colors can be obtained by a color filter film, and then color display can be obtained by combining the three primary colors. For example, as shown in FIG. 1, a passivation layer 6 may be firstly disposed on the second electrode layer 4 to protect the second electrode layer 4 and make it insulated from other materials, and then a color filter film 5 is disposed at positions on the passivation layer 6 directly over the first electrodes. The color filter film 5 is composed of a plurality of sets of discrete color filters and does not include back matrixes, and each set of color filters includes red, green and blue color filters respectively, so that the luminescent units including the red, green and blue color filters can emit red, green and blue light respectively. In this way, the white light emitted from the organic luminescent layer 3 will generate the three primary colors of red, green and blue after transmitting through each set of color filters, and then the three primary colors of red, green and blue will be mixed into the multicolor so as to achieve a full-color display. In particular, the specific materials for the passivation layer 6 is not limited in the present invention. For example, the passivation layer 6 may be made of polymer materials such as resins, or may be made of inorganic non-metallic materials such as silicon nitride (SiN) or silicon oxide ($SiO_2$).

In the OLED display panel according to the embodiments of the present invention, since the opaque light-isolating members 9 function to isolate the light emitting from the respective luminescent units, it is not necessary to dispose black matrixes between the respective color filters in the color filter film 5, such that the OLED display panel is simplified in structure and the process for manufacturing the black matrixes is not necessary, thereby simplifying the process and saving the cost for manufacturing.

It is noted that, in the embodiments of the present invention, the organic luminescent layer 3 may be continuously disposed on the first electrode layer 2 as shown in FIGS. 1 and 2, i.e., may be continuously disposed on each first electrode and each light-isolating member 9; alternatively, the organic luminescent layer 3 may be discontinuously disposed on the first electrode layer 2 as shown in FIG. 3, i.e., may be discontinuously disposed on the first electrodes between the respective light-isolating members 9. In short, as long as the light emitted from the organic luminescent layer 3 is ensured to pass through the second electrode layer 4 and to exit through the color filter film 5, the arrangement of the organic luminescent layer is not limited herein.

Similarly, in the embodiments of the present invention, the second electrode layer 4 may be continuously disposed on the organic luminescent layer 3 as shown in FIGS. 1 to 3; alternatively, the second electrode layer 4 may be discontinuously disposed on the organic luminescent layer 3, i.e., may be discontinuously disposed on the organic luminescent layer 3 between the respective light-isolating members 9. In short, as long as the light emitted from the organic luminescent layer 3 is ensured to pass through the second electrode layer 4 and to exit through the color filter film 5, the arrangement of the second electrode layer is not limited herein.

In addition, as illustrated in FIG. 1, a packaging layer 7 may also be disposed on the color filter film 5 to prevent the second electrode layer 4 or the organic luminescent layer 3 from being corroded by water or oxygen. Particularly, the specific materials for the packaging layer 7 are not limited in the present invention. For example, the packaging layer 7 may be made of inorganic non-metallic materials such as silicon nitride (SiN) or silicon oxide ($SiO_2$), or polymer materials such as resins.

In the embodiments of the present invention, in order to allow the white light emitted from the organic luminescent layer 3 to exit through the color filter film 5 as much as possible, a reflective layer (not shown), for example a metal layer, may be disposed on a side of the first electrode layer 2 close to the substrate 1. In this way, the white light emitted from the organic luminescent layer 3 will directly pass through the second electrode layer 4 and exit through the color filter film 5, or the white light will pass through the second electrode layer 4 and exit through the color filter film 5 after being reflected by the reflective layer.

It is noted that, in embodiments of the present invention, the color filter film 5 may be directly disposed on the first electrodes between the respective light-isolating members 9, and then the passivation layer 6 and the packaging layer 7 are sequentially disposed on the color filter film 5, as shown in FIGS. 2 and 3. In this way, each of the color filters of the color filter film 5 is only disposed on the first electrodes between the respective light-isolating members 9, and thus the light-isolating members 9 also function to position the color filters. That is, after disposing the second electrode layer 4, it is only needed to dispose each of the color filters on recesses between the respective light-isolating members 9. In this way, the light-isolating members 9 are protuberances projected relative to the first electrodes and thus function to position the color filters well.

other embodiments of the present invention further provide a display apparatus comprising any one of the organic electroluminescence display panel as described in the above embodiments. The display apparatus thus can achieve the effects as described above, and the description thereof in details is omitted herein.

Figure 4:
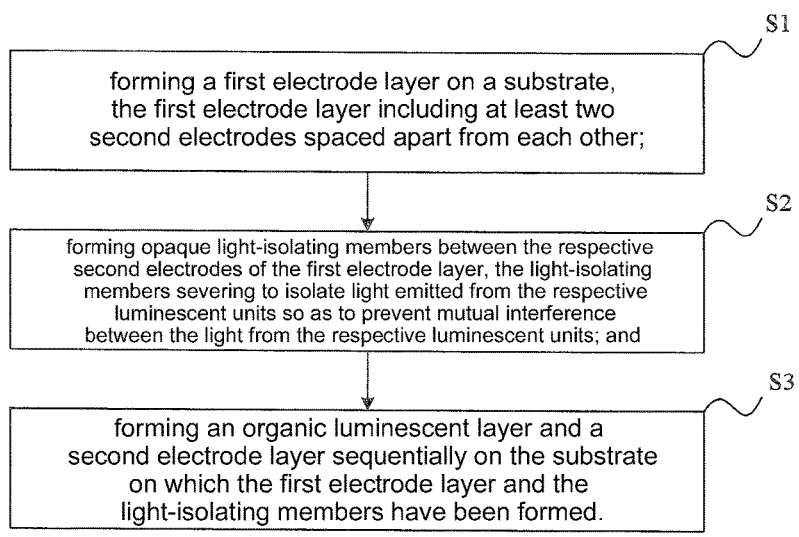
FIG. 4 is a flow chart of a method for manufacturing an organic electroluminescent display panel according to an exemplary embodiment of the present invention.

In another aspect of the present invention, as shown in FIG. 4, embodiments of the present invention further provides a method for manufacturing an organic electroluminescence display panel comprising the steps of:

S1: forming a first electrode layer on a substrate, the first electrode layer including at least two first electrodes spaced apart from each other;

S2: forming opaque light-isolating members between the respective first electrodes of the first electrode layer, the light-isolating members serving to isolate light emitted from the respective luminescent units to prevent mutual interference between the light from the respective luminescent units; and S3: forming an organic luminescent layer and a second electrode layer sequentially on the substrate on which the first electrode layer and the light-isolating members have been formed.

It is noted that, in embodiments of the present invention, each first electrode and the organic luminescent layer and the second electrode layer directly opposite the second electrode constitute one luminescent unit.

Alternatively, the light-isolating members are made of an opaque polymer composite material.

Preferably, the light-isolating members are made of a black matrix material.

In particular, the step S3 of forming the organic luminescent layer and the second electrode layer sequentially on the substrate on which the first electrode layer and the light-isolating members have been formed further comprises:

S31: forming a continuous organic luminescent layer on the substrate on which the first electrode layer and the light-isolating members have been formed, the organic luminescent layer being continuously formed on each first electrode and each light-isolating member; or S32: forming a discontinuous organic luminescent layer on the substrate on which the first electrode layer and the light-isolating members have been formed, the organic luminescent layer being discontinuously formed on the first electrodes between the respective light-isolating members.

Further, after the step S3 of forming an organic luminescent layer and a second electrode layer sequentially on the substrate on which the first electrode layer and the light-isolating members have been formed, the method further comprises:

S41: forming a passivation layer on the second electrode layer; and

S51: forming a color filter film at positions on the passivation layer corresponding to the first electrodes.

Alternatively, after the step S51 of forming a color filter film at positions on the passivation layer corresponding to the first electrodes, the method further comprises:

S61: forming a packaging layer on the color filter film.

Alternatively, further, after the step S3 of forming an organic luminescent layer and a second electrode layer sequentially on the substrate on which the first electrode layer and the light-isolating members have been formed, the method further comprises:

S42: forming a color filter film on the first electrodes between the respective light-isolating members.

Alternatively, after the step S42 of forming a color filter film on the first electrodes between the respective light-isolating members, the method further comprises:

S52: forming a passivation layer and a packaging layer on the color filter film sequentially.

In the method for manufacturing the OLED display panel according to embodiments of the present invention, each first electrode, and the organic luminescent layer and the second electrode layer directly opposite the first electrode constitute one luminescent unit, and opaque light-isolating members are disposed between the respective first electrodes. In this way, the opaque light-isolating members can effectively isolate the light emitted from the organic luminescent layers in the respective luminescent units so as to prevent the mutual interference between the light from the respective luminescent units, thereby improving the full-color display effect of the OLED display panel.

Although several exemplary embodiments have been shown and described above, the present invention is not limited herein, and it would be appreciated by those skilled in the art that various changes or modifications may be made in these embodiments without departing from the principle and spirit of the disclosure, the scope of which is defined in the claims and their equivalents.

For example, although the above embodiments have been described in which the light-isolating members are disposed between the first electrode layers 2 of the respective luminescent units, the light-isolating members may also be disposed between the second electrode layers 4 of the respective luminescent units or the organic luminescent layers 3 of the respective luminescent units, as long as the light-isolating members can isolate the light emitted from the respective luminescent units.

Therefore, the scope of the invention should be based on that defined in the appended claims.

What is claimed is:

1. An organic electroluminescent display panel comprising:
   a substrate, and a plurality of luminescent units disposed on the substrate, wherein the organic electroluminescent display panel is a single substrate structure, and wherein each luminescent unit includes:
   a first electrode layer;
   an organic luminescent layer disposed on the first electrode layer; and
   a second electrode layer disposed on the organic luminescent layer,
   wherein light-isolating members are disposed between the plurality of luminescent units for isolating light emitted from respective luminescent units, and
   wherein:
   the organic luminescent layers of the respective luminescent units are continuously disposed on the first electrode layers of the respective luminescent units and the light-isolating members between the respective luminescent units without any discontinuity,
   the first electrode layer, the organic luminescent layer and the second electrode layer are sequentially disposed on the substrate; and the first electrode layers of the respective luminescent units are separated from each other with the light-isolating members intervening therebetween, and a passivation layer is disposed on the second electrode layer, the passivation layer comprises a continuous flat top and sidewalls on both sides of the continuous flat top, orthogonal projections of the luminescent units and the light-isolating members on the substrate fall in an orthogonal projection of the continuous flat top on the substrate, a surface of the continuous flat top facing away from the second electrode layer is located in a single horizontal plane, the sidewalls are located at edges of the substrate, respectively, and cover ends of the second electrode layer located at edges of the substrate, respectively, a plurality of color filter films are discontinuously disposed at positions on the top of the passivation layer corresponding to the first electrode layers and cover portions of the top of the passivation layer, and a packaging layer as an outer surface layer of the organic electroluminescent display panel is disposed on the color filter films to cover the passivation layer and the color filter films, the packaging layer comprises a flat top and sidewalls on both sides of the flat top, the packaging layer covers portions of the continuous flat top of the passivation layer, which are not covered by color filter film, and side walls of the passivation layer, and a gap between any two adjacent color filter films is filled with the packaging layer, wherein the packaging layer is not in contact with a black matrix.

2. The organic electroluminescent display panel according to claim 1, wherein at least one of the first electrode layers, the organic luminescent layers and the second electrode layers of the respective luminescent units are isolated by the light-isolating members.

3. The organic electroluminescent display panel according to claim 1, wherein the light-isolating members are protrusively disposed between the respective luminescent units.

4. The organic electroluminescent display panel according to claim 1, wherein the light-isolating member is made of an opaque polymer composite material.

5. The organic electroluminescent display panel according to claim 1, wherein the light-isolating member is made of a black matrix material.

6. A display apparatus comprising the organic electroluminescent display panel according to claim 1.

7. A method for manufacturing an organic electroluminescent display panel comprising steps of:
forming a first electrode layer on a substrate, wherein the organic electroluminescent display panel is a single substrate structure, the first electrode layer including at least two first electrodes spaced apart from each other;
forming light-isolating members between the respective first electrodes of the first electrode layer, the light-isolating members severing to isolate light emitted from respective luminescent units; and
forming an organic luminescent layer and a second electrode layer sequentially on the substrate on which the first electrode layer and the light-isolating members have been formed;
forming a passivation layer on the second electrode layer, wherein the passivation layer comprises a continuous flat top and sidewalls on both sides of the continuous flat top, wherein orthogonal projections of the luminescent units and the light-isolating members on the substrate fall in an orthogonal projection of the continuous flat top on the substrate, a surface of the continuous flat top facing away from the second electrode layer is located in a single horizontal plane, the sidewalls are located at edges of the substrate, respectively, and cover ends of the second electrode layer located at edges of the substrate, respectively;
discontinuously forming a plurality of color filter films which cover portions of the top of the passivation layer on the top of the passivation layer at positions corresponding to the first electrodes; and
forming a packaging layer as an outer surface layer of the organic electroluminescent display panel on the color filter films to cover the passivation layer and the color filter films, wherein the packaging layer is not in contact with a black matrix and the packaging layer comprises a flat top and sidewalls on both sides of the flat top;
wherein the packaging layer covers portions of the continuous flat top of the passivation layer, which are not covered by color filter films, and side walls of the passivation layer, and a gap between any two adjacent color filter films is filled with the packaging layer; and
wherein the step of forming an organic luminescent layer and a second electrode layer sequentially on the substrate on which the first electrode layer and the light-isolating members have been formed further comprises:
forming a continuous organic luminescent layer on the substrate on which the first electrode layer and the light-isolating members have been formed, the organic luminescent layer being continuously formed on each first electrode and each light-isolating member without any discontinuity.

8. The method according to claim 7, wherein the light-isolating member is made of an opaque polymer composite material.

9. The method according to claim 7, wherein the light-isolating member is made of a black matrix material.

* * * * *